US011569095B2

(12) United States Patent
Hautala

(10) Patent No.: US 11,569,095 B2
(45) Date of Patent: *Jan. 31, 2023

(54) TECHNIQUES AND APPARATUS FOR SELECTIVE SHAPING OF MASK FEATURES USING ANGLED BEAMS

(71) Applicant: APPLIED Materials, Inc., Santa Clara, CA (US)

(72) Inventor: John Hautala, Beverly, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/328,253

(22) Filed: May 24, 2021

(65) Prior Publication Data
US 2021/0324519 A1 Oct. 21, 2021

Related U.S. Application Data

(62) Division of application No. 16/730,586, filed on Dec. 30, 2019, now Pat. No. 11,043,394.

(Continued)

(51) Int. Cl.
H01L 21/311 (2006.01)
C23C 16/50 (2006.01)
(Continued)

(52) U.S. Cl.
CPC ...... H01L 21/31116 (2013.01); C23C 14/225 (2013.01); C23C 16/4583 (2013.01);
(Continued)

(58) Field of Classification Search
CPC ........... H01L 21/31116; H01L 21/3086; H01L 21/31144; H01L 21/02274;
(Continued)

(56) References Cited

U.S. PATENT DOCUMENTS 7,872,406 B2 1/2011 Matacotta
10,840,132 B1 11/2020 Gilchrist et al.
(Continued)

FOREIGN PATENT DOCUMENTS

CN 103199058 A * 7/2013 ........... H01L 21/768
KR 10-2007-0119072 A 12/2001
WO 2015035116 A1 3/2015

OTHER PUBLICATIONS

Translation of KR 20170002562A (Year: 2017).*
(Continued)

Primary Examiner — Duy Vu N Deo
(74) Attorney, Agent, or Firm — KDB Firm PLLC

(57) ABSTRACT

A method may include providing a set of features in a mask layer, wherein a given feature comprises a first dimension along a first direction, second dimension along a second direction, orthogonal to the first direction, and directing an angled ion beam to a first side region of the set of features in a first exposure, wherein the first side region is etched a first amount along the first direction. The method may include directing an angled deposition beam to a second side region of the set of features in a second exposure, wherein a protective layer is formed on the second side region, the second side region being oriented perpendicularly with respect to the first side region. The method may include directing the angled ion beam to the first side region in a third exposure, wherein the first side region is etched a second amount along the first direction.

9 Claims, 13 Drawing Sheets

Related U.S. Application Data

(60) Provisional application No. 62/949,582, filed on Dec. 18, 2019.

(51) Int. Cl.

| | | |
|---|---|---|
| *H01J 37/32* | (2006.01) | |
| *C23C 16/458* | (2006.01) | |
| *C23C 16/455* | (2006.01) | |
| *C23C 14/22* | (2006.01) | |
| *H01L 21/308* | (2006.01) | |
| *C23C 14/34* | (2006.01) | |
| *C23C 14/46* | (2006.01) | |

(52) U.S. Cl.
CPC ........ *C23C 16/45563* (2013.01); *C23C 16/50* (2013.01); *H01J 37/32458* (2013.01); *H01J 37/32623* (2013.01); *H01J 37/32816* (2013.01); *H01L 21/3086* (2013.01); *H01L 21/31144* (2013.01); *C23C 14/3442* (2013.01); *C23C 14/46* (2013.01); *H01J 2237/3321* (2013.01)

(58) Field of Classification Search
CPC ............. H01L 21/68764; C23C 14/225; C23C 16/45563; C23C 16/4583; C23C 16/50; C23C 14/3442; C23C 14/46; C23C 14/048; C23C 14/221; C23C 16/047; C23C 16/452; C23C 16/45578; C23C 16/513; H01J 37/32458; H01J 37/32623; H01J 37/32816; H01J 2237/3321; H01J 37/32357

USPC .................................................. 438/694–714
See application file for complete search history.

(56) References Cited

U.S. PATENT DOCUMENTS

| | | |
|---|---|---|
| 10,879,055 B2 | 12/2020 | Hatem et al. |
| 11,043,394 B1 * | 6/2021 | Hautala ............. H01J 37/32458 |
| 2005/0034666 A1 | 2/2005 | Chistyakov |
| 2008/0164819 A1 | 7/2008 | Hwang et al. |
| 2009/0098306 A1 | 4/2009 | Druz et al. |
| 2014/0170795 A1 | 6/2014 | Prabhakar et al. |
| 2014/0202633 A1 | 7/2014 | Godet et al. |
| 2015/0011093 A1 | 1/2015 | Singh et al. |
| 2015/0069017 A1 | 3/2015 | Buonodono |
| 2016/0379816 A1 | 12/2016 | Ruffell et al. |
| 2017/0069488 A1 * | 3/2017 | Yieh ................... H01L 21/0228 |
| 2019/0355581 A1 | 11/2019 | Anglin et al. |
| 2020/0194271 A1 * | 6/2020 | Anglin ............. H01L 21/67201 |
| 2021/0020499 A1 | 1/2021 | Gilchrist et al. |

OTHER PUBLICATIONS

International Search Report dated Feb. 22, 2021, for the International Patent Application No. PCT/US2020/057253, filed on Oct. 25, 2020, 4 pages.

Written Opinion dated Feb. 22, 2021, for the International Patent Application No. PCT/US2020/057253, filed on Oct. 25, 2020, 5 pages.

* cited by examiner

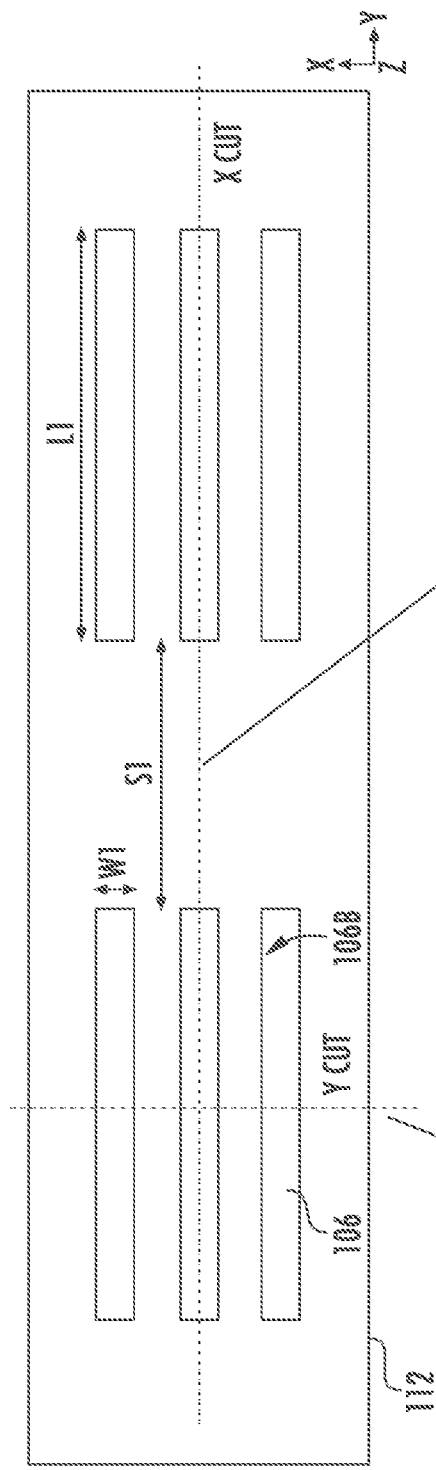
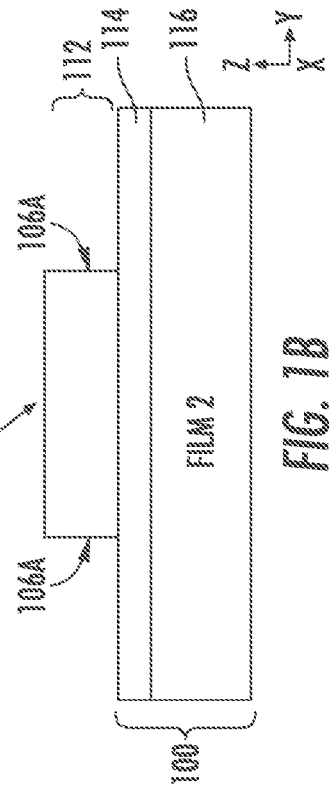
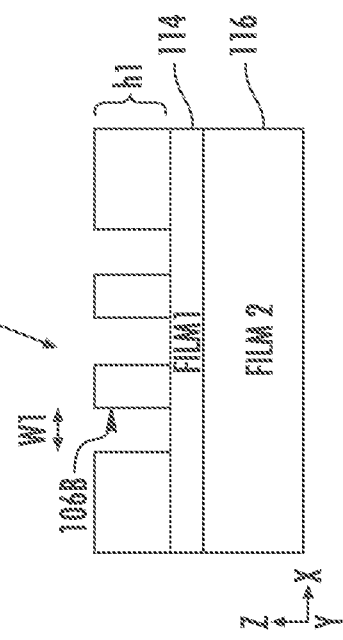
FIG. 1A
FIG. 1B
FIG. 1C

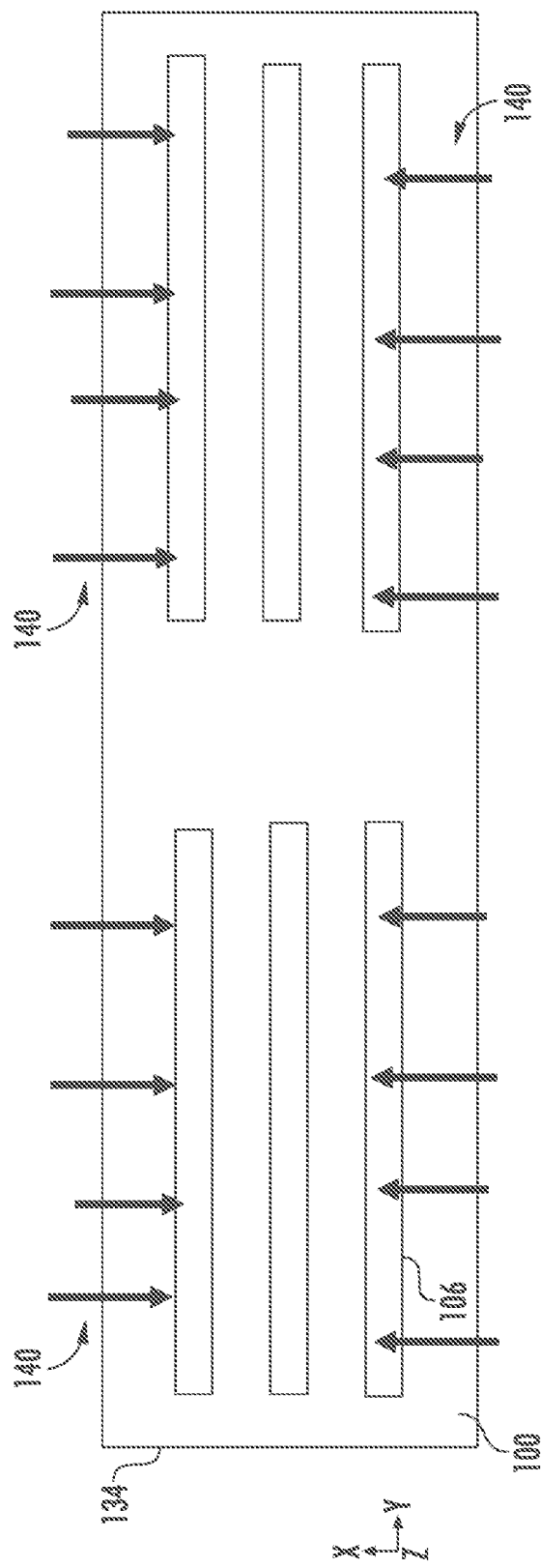
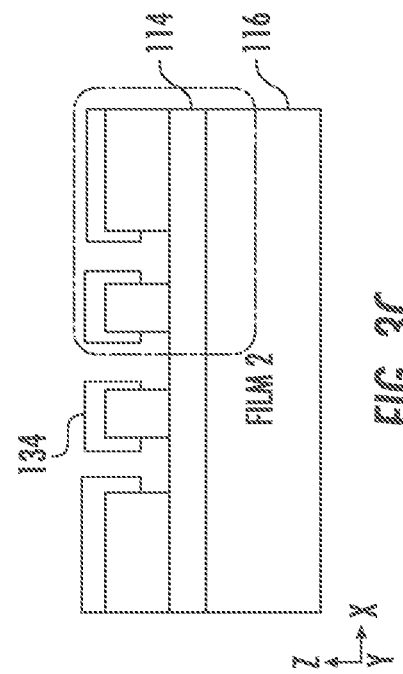
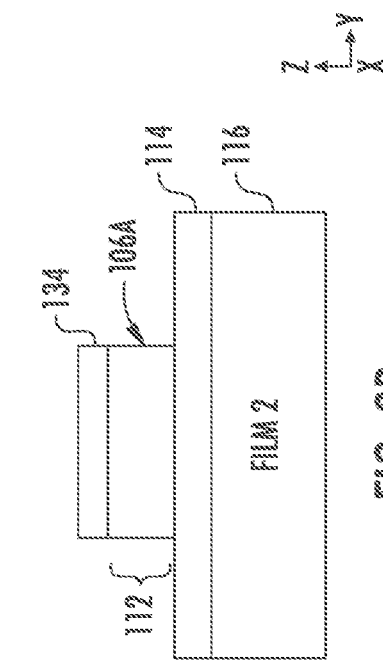

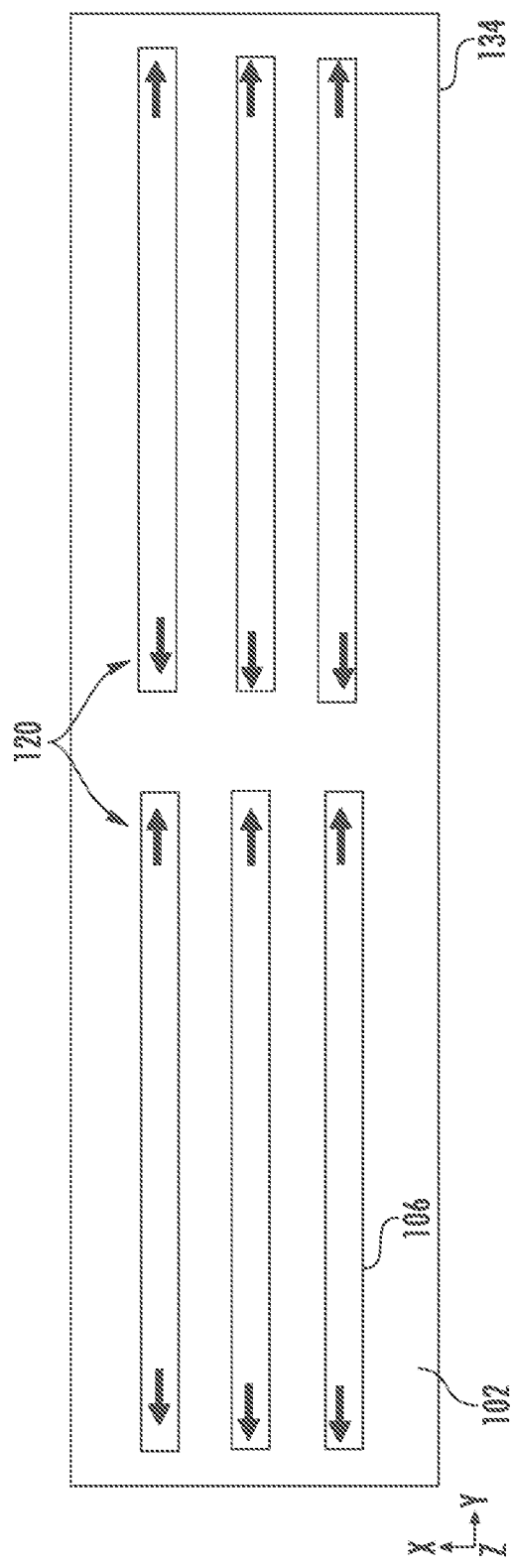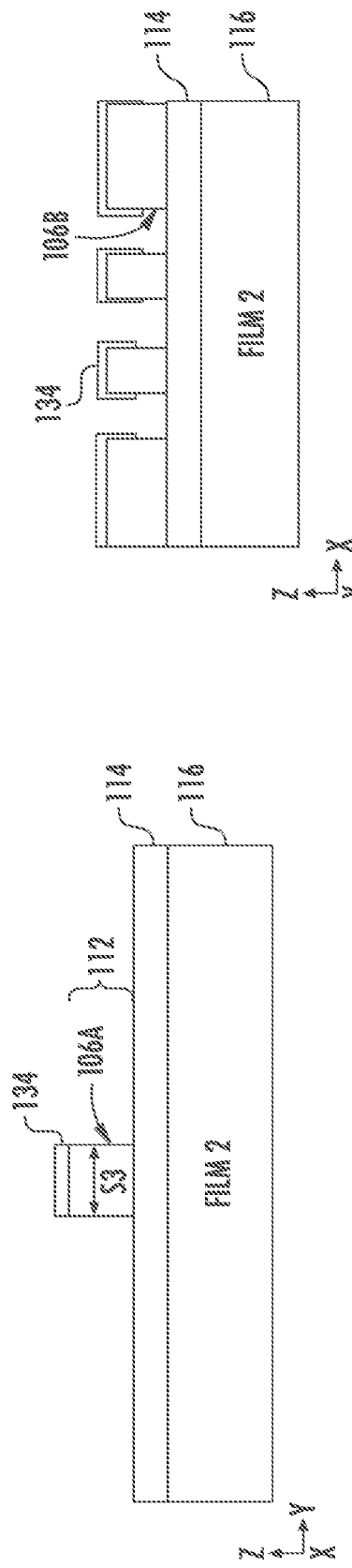

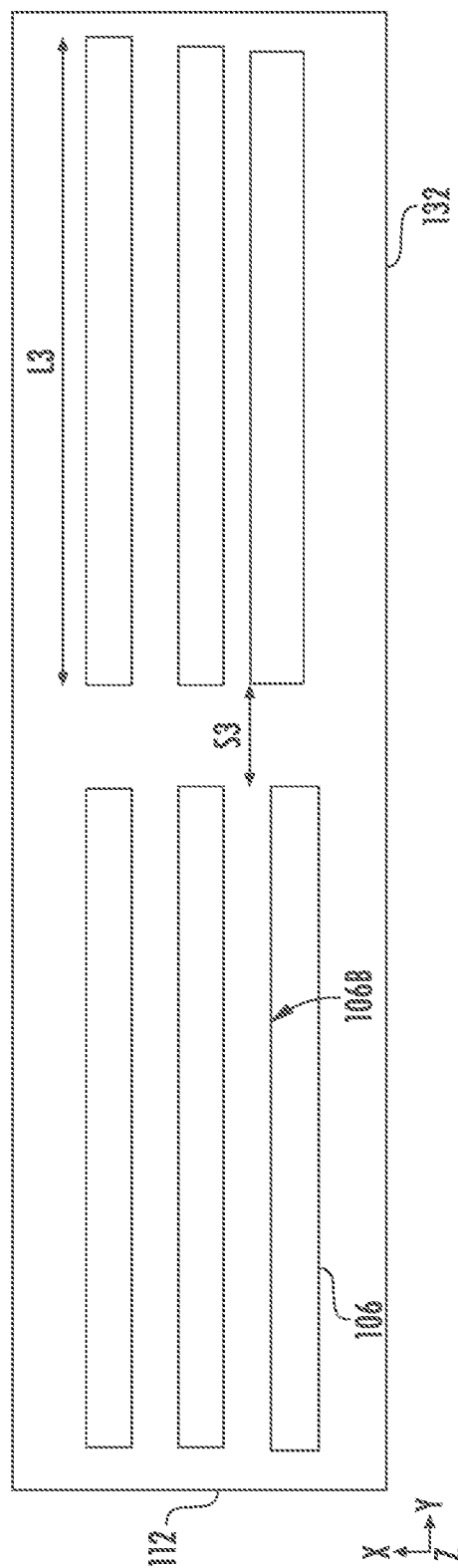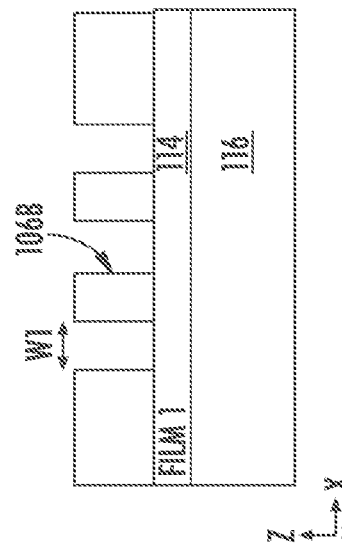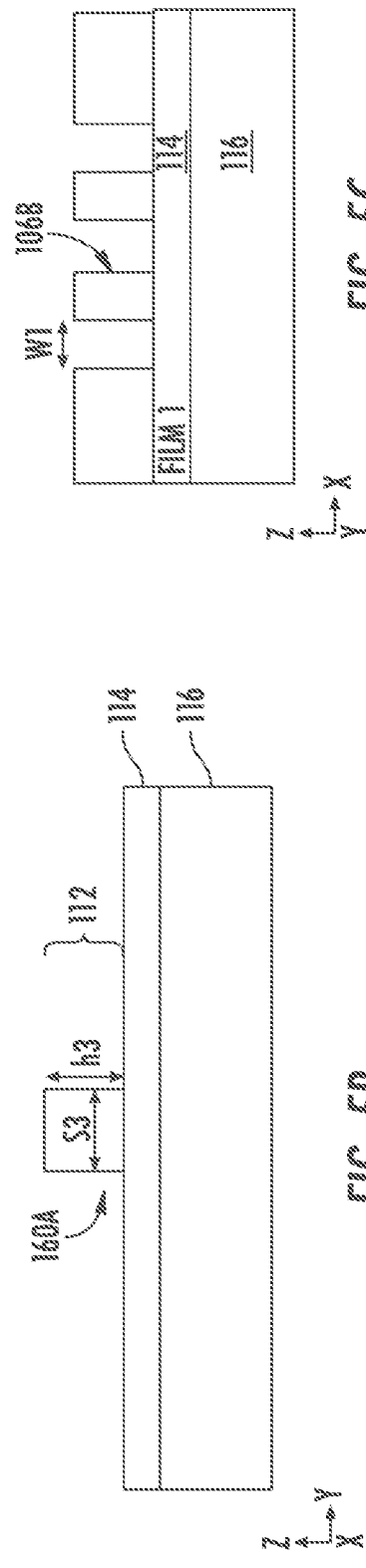

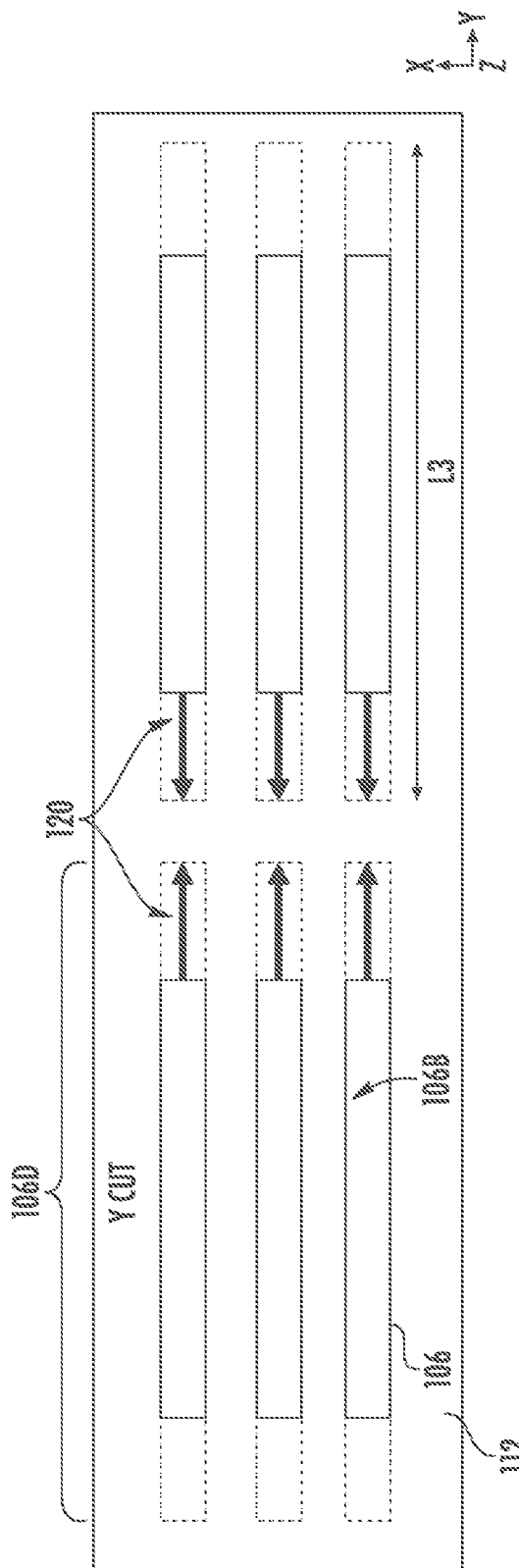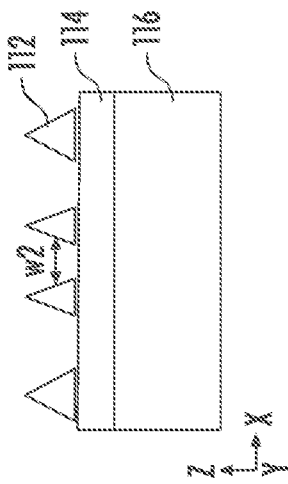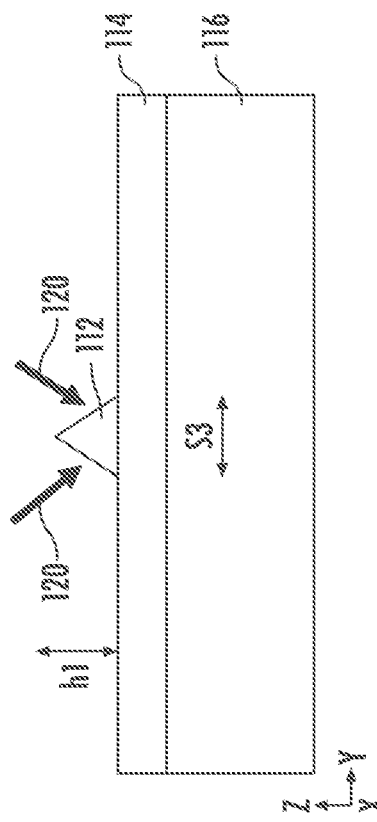
FIG. 6A
FIG. 6B
FIG. 6C

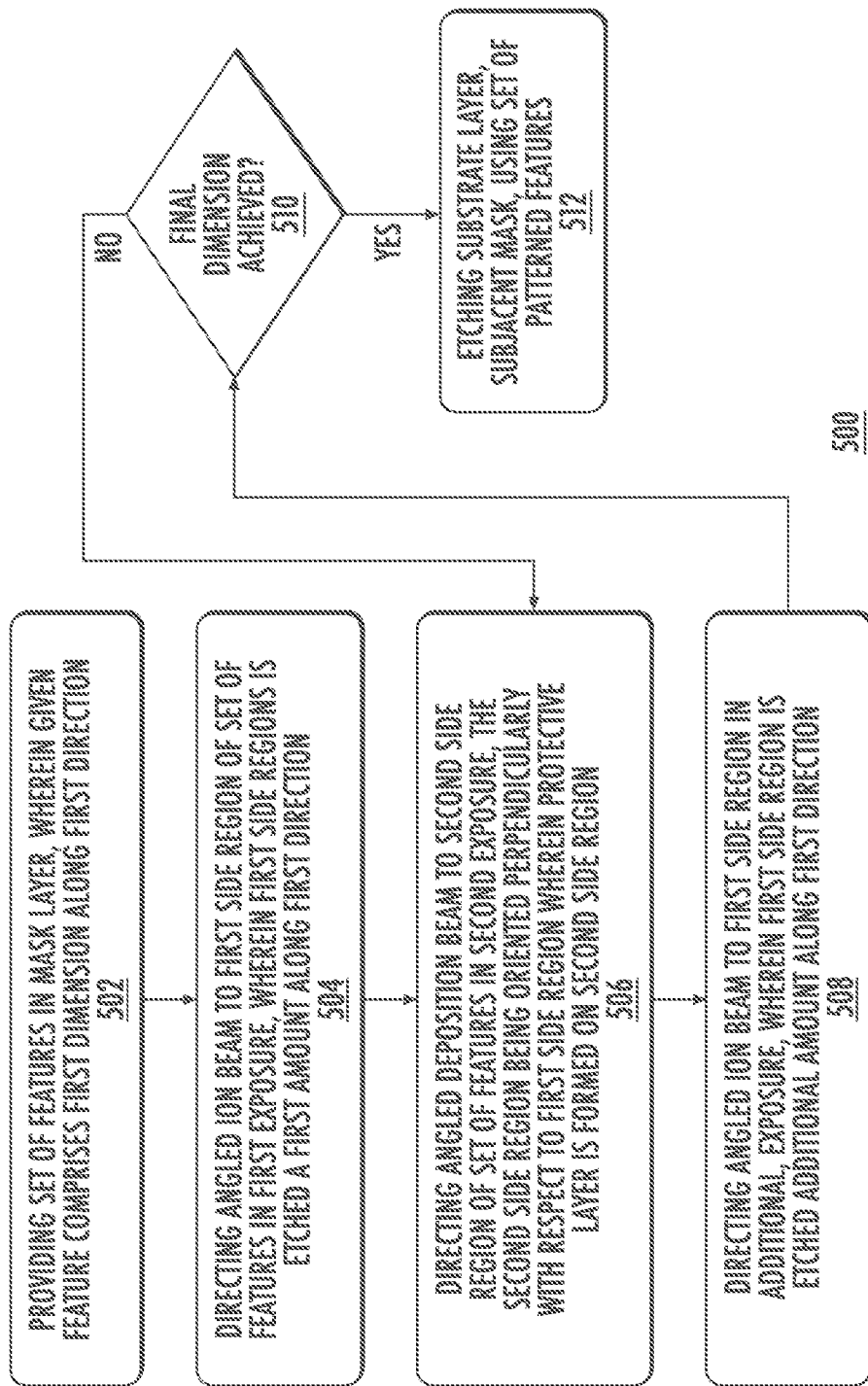

TECHNIQUES AND APPARATUS FOR SELECTIVE SHAPING OF MASK FEATURES USING ANGLED BEAMS

RELATED APPLICATIONS

The present application claims priority to and is a divisional application of U.S. Non-Provisional patent application Ser. No. 16/730,586, filed on Dec. 30, 2019, entitled "TECHNIQUES AND APPARATUS FOR SELECTIVE SHAPING OF MASK FEATURES USING ANGLED BEAMS," which claims priority to U.S. Provisional Patent Application Ser. No. 62/949,582, filed Dec. 18, 2019, entitled "RIBBON BEAM PLASMA ENHANCED CHEMICAL VAPOR DEPOSITION SYSTEM FOR ANISOTROPIC DEPOSITION OF THIN FILMS," and incorporated by reference herein in their entirety.

FIELD

The present embodiments relate to substrate processing techniques, and more particularly, to etch processing for patterning structures and devices.

BACKGROUND

As devices such as a semiconductor devices, optical devices, or devices electronic devices, continue to scale to smaller dimensions, the ability to pattern features becomes increasingly difficult. In addition to challenging the ability to lithographically define smaller lateral mask features to pattern an underlying substrate or layer to generate features having similar lateral dimension, the maximum thickness of mask features is continuing to shrink to satisfy lithographic requirements.

Moreover, changing the size of such mask features after lithographic patterning may be useful, such as by etching. For example, to generate a given array of cavities at a targeted large size and small separation between cavities, one possible strategy is to pattern the array of cavities lithographically to a relatively smaller size with a larger separation between cavities, and then etch the cavities to enlarge the cavities. In particular, selectively etching a cavity along a given direction may be useful. Notably, a drawback of etching a cavity formed in a given mask layer is the loss of mask layer thickness during the etching, leading to the inability to pattern an underlying feature after the mask etching. Additionally, the cavities may be imperfectly etched, leading to a non-ideal mask shape.

With respect to these and other considerations the present embodiments are provided.

BRIEF SUMMARY

In one embodiment, a method of patterning a substrate is provided. The method may include providing a set of features in a mask layer, the mask layer being disposed on a layer of the substrate, wherein a given feature comprises a first dimension along a first direction, a second dimension along a second direction, orthogonal to the first direction, and a first thickness. The method may also include directing an angled ion beam to a first side region of the set of features in a first exposure, wherein the first side region is etched a first amount along the first direction. The method may further include directing an angled deposition beam to a second side region of the set of features in a second exposure, wherein a protective layer is formed on the second side region, the second side region being oriented perpendicularly with respect to the first side region. The method may include directing the angled ion beam to the first side region in a third exposure, wherein the first side region is etched a second amount along the first direction.

In another embodiment, a method of patterning a substrate, may include providing a set of features in a mask layer, the mask layer being disposed on a surface of the substrate and comprising a first material, wherein a given feature comprises a first dimension along a first direction, a second dimension along a second direction, orthogonal to the first direction, and a first thickness. The method may include repeatedly performing an etch cycle to selectively etch the set of features, the etch cycle comprising: directing an angled ion beam to the set of features in a first exposure, when the substrate is oriented at a first twist angle, wherein the set of features is etch a first amount along the first direction. The method may also include rotating the substrate to a second twist angle after the directing the angled ion beam, and directing an angled deposition beam the set of features in a second exposure, wherein a protective layer is formed on a protected portion of the set of features.

In a further embodiment, an apparatus may include a plasma chamber to generate a processing plasma, and a substrate stage, to support a substrate, and disposed adjacent to the plasma chamber. The apparatus may also include an extraction assembly, disposed along a side of the plasma chamber, between the plasma and the substrate stage, to extract plasma species from the plasma, and a bias voltage source to apply a bias voltage between the plasma chamber and the substrate. The apparatus may include a controller to send a first control signal to the bias voltage source to apply a first bias voltage between the plasma chamber and the substrate while the substrate stage is arranged at a first twist angle. The controller may be arranged to send a second control signal to the bias voltage source to apply second bias voltage between the plasma chamber and the substrate, the second bias voltage being less in absolute magnitude than the first bias voltage, and to send concurrently with the second control signal, a third control signal to rotate the substrate stage to a second twist angle.

BRIEF DESCRIPTION OF THE DRAWINGS

FIGS. 1A-5C generally depict the structure of a substrate at different stages of processing, according to embodiments of the present disclosure;

FIG. 1A depicts a top view of a substrate after patterning to form a mask layer;

FIG. 1B depicts a side cross-sectional view of the substrate of FIG. 1A;

FIG. 1C depicts an end cross-sectional view of the substrate of FIG. 1A;

FIG. 3A depicts a top view of the substrate of FIG. 1A, subsequent to the instance of FIG. 2A, after processing by a deposition beam;

FIG. 3B depicts a side cross-sectional view of the substrate of FIG. 3A;

FIG. 3C depicts an end cross-sectional view of the substrate of FIG. 3A;

FIG. 4A depicts a top view of the substrate of FIG. 1A, subsequent to the instance of FIG. 3A, after further processing by an ion beam;

FIG. 4B depicts a side cross-sectional view of the substrate of FIG. 4A;

FIG. 4C depicts an end cross-sectional view of the substrate of FIG. 4A;

FIG. 5A depicts a top view of the substrate of FIG. 1A, subsequent to the instance of FIG. 4A, after further processing;

FIG. 5B depicts a side cross-sectional view of the substrate of FIG. 5A;

FIG. 5C depicts an end cross-sectional view of the substrate of FIG. 5A;

FIG. 6A depicts a top view of the substrate of FIG. 1A, illustrating a targeted mask pattern after directional etching;

FIG. 6B depicts a side cross-sectional view of the substrate of FIG. 6A after directional etching using an ion beam, while not employing a deposition beam;

FIG. 6C depicts an end cross-sectional view of the substrate of FIG. 6B;

FIG. 10 depicts an exemplary process flow, according to one embodiment;

DETAILED DESCRIPTION

Figure 2A:
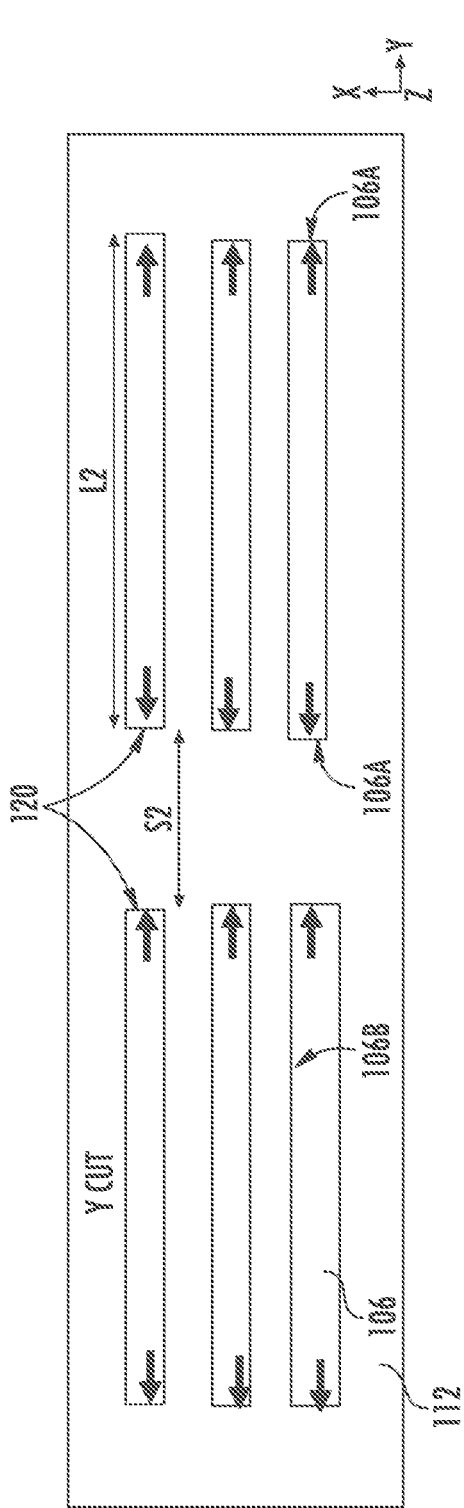
FIG. 2A depicts a top view of the substrate of FIG. 1A, subsequent to the instance of FIG. 1A, after processing by an ion beam.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques and apparatus to pattern substrates and in particular novel techniques to etch a cavity disposed in a substrate, along a designed direction. In various embodiments, a feature such as a via or trench may be formed having an initial shape and size, and may be subsequently elongated along the designed direction using a series of etch operations. The designed direction may correspond to a horizontal direction within a plane of the substrate. According to various embodiments, the elongation of the feature may take place along the designed direction (first direction) while the cavity is not enlarged or enlarged to a lesser extent along a perpendicular direction to the designed direction (second direction) within the plane of the substrate. In this manner, a cavity may be selectively elongated along just one direction, providing various concomitant advantages for patterning substrates, as disclosed herein.

According to the embodiments disclosed herein, a mask having a set of patterned features may be processed in an iterative fashion to selectively etch mask features and selectively deposit a protective layer of material or replenishment material to avoid unwanted etching of the mask features in certain portions of the mask features. In some embodiments, a directional ribbon beam is employed to iteratively process etch a patterned feature. The iterative processing may involve repeating a directional etch operation that is interspersed with a directional deposition operation. In one example, a processing operation may involve etching certain regions of a patterned feature of a mask, such as a sidewall or endwall of a cavity in a desired direction, followed by rotation of the mask, and directional deposition of protective or replenishing layer on other regions of the mask. After the directional deposition, the mask may be rotated back to an original position, and directional etching of the cavity or other patterned feature along the desired direction resumed. In this manner, the patterned feature of the mask may be etched to a desired length along a desired direction, while preventing unwanted etching of patterned features that may otherwise occur during prolonged directional etching along a specific direction. According to some embodiments, disclosed below, the iterative directional etching and direction deposition may be performed on a mask, using a common processing plasma chamber, where biasing between a substrate containing the mask and the plasma chamber is switched from negative bias to zero bias between the direction etching operation and direction deposition operation, respectively.

In different embodiments of the disclosure, directional deposition and directional etching may be performed using a common plasma chamber to extract directional beams, where the directional deposition employs the same chemistry as the directional etching, where directional deposition is accomplished by decreasing the bias between plasma chamber and substrate, as compared to the bias applied to generate the directional etching. As an example, plasma species including ions may be extracted from the plasma chamber to form an ion beam to perform directional etching using a relatively high bias, while plasma species including radicals, neutrals, and possibly ions may be extracted from the plasma chamber to form a deposition beam to perform directional deposition using a relatively low bias or zero bias.

Turning now to the figures, FIGS. 1A-5C generally depict the structure of a substrate at different stages of processing, according to embodiments of the present disclosure. According to various embodiments, as shown in the FIGS. 1A-5C, a selective etching operation is performed using a combination of a deposition operation and an etch operation that are performed in a sequential and iterative manner. FIG. 1A depicts a top view of a substrate after patterning to form a mask layer, while FIG. 1B depicts a side cross-sectional view of the substrate of FIG. 1A, and FIG. 1C depicts an end cross-sectional view of the substrate of FIG. 1A. In FIG. 1A, a substrate 100 is shown, including a mask layer 112 that defines a mask having an array of patterned features, in this example, a set of cavities, shown as cavities 106. The mask layer 112 is disposed on other parts of a substrate, such as a layer 114, subjacent the mask layer 112, and a layer 116, subjacent the layer 114.

According to various embodiments of the disclosure, the mask layer 112 may be a photoresist material, a hard mask material, a carbon material, an oxide such as silicon oxide, a nitride such as silicon nitride, or other suitable mask material. The mask layer 112 may be used to mask the layer 114, so that the pattern of cavities 106 may be transferred into the layer 114, for example, by a known etching process—such as reactive ion etching (RIE). In various embodiments, the layer 114 may be a different material than the material of mask layer 112. For example, the mask layer 112 may be formed of silicon nitride or carbon, while the layer 114 is formed of silicon or silicon oxide. Likewise the layer 116 may be a different material than the material of layer 114. For example, the layer 114 may be formed of silicon oxide, while the layer 116 is formed of silicon. The embodiments are not limited in this context.

In the present embodiments, before transferring of the pattern of the mask layer 112 into the layer 114, the mask layer 112 may be processed to selectively change the pattern of the mask layer 112, for example to selectively change the dimensions of the cavities 106, to change the spacing between cavities 106, and so forth. For example, device patterning of the substrate 100 may call for the cavities 106 to be separated by a tip-to-tip spacing, shown as S2, in FIG. 5A. After lithographic patterning, the mask layer 112 may exhibit a tip-to-tip spacing shown as S1. In some instances, lithographic patterning may be limited to image spacings between adjacent cavities less than a given amount, such as S1, along the Y-direction of the Cartesian coordinate system shown. For example, the value of S1 may be on the order of a few nanometers, or a few tens of nanometers, where lithographic patterning may not resolve spacings smaller than S1 within the mask layer 112. For this reason, the mask layer 112, after patterning to generate the pattern of FIG. 1A, having the length of cavities of L1 and separation of S1 along the Y-direction, may be subjected to selective etching and deposition processes, to change the dimension of the cavities, the spacing between cavities, long at least one direction, and in some cases to change the shape of the cavities. Such combined etching and deposition processes may be referred to herein as selectively shaping a patterned feature, such as a cavity.

Figure 2B:
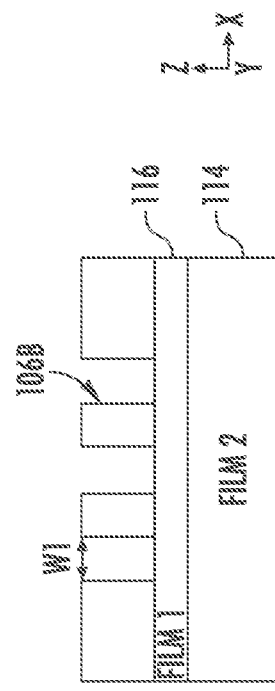
FIG. 2B depicts a side cross-sectional view of the substrate of FIG. 2A.
Figure 2C:
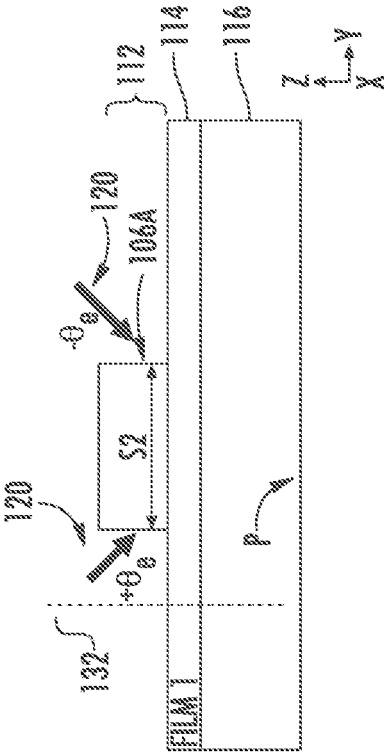
FIG. 2C depicts an end cross-sectional view of the substrate of FIG. 2A.

At a subsequent instance, FIG. 2A depicts a top view of the substrate of FIG. 1A, after processing by an angled ion beam 120. FIG. 2B depicts a side cross-sectional view of the substrate of FIG. 2A, while FIG. 2C depicts an end cross-sectional view of the substrate of FIG. 2A. At the instance of FIG. 2A, the angled ion beam 120 is directed to a first side region of the set of features of the mask layer 112, meaning a side region of the cavities 106. The first side region may represent a sidewall, an endwall, a portion of a sidewall in various non-limiting embodiments. In this example, the first side region of the cavities 106 is represented by endwalls 106A. In various non-limiting embodiments, the cavities 106 may be trenches that are elongated along the Y-axis. As such, the angled ion beam may etch the endwalls 106A a first amount along a first direction, parallel to the Y-axis. Notably, the angled ion beam 120 may be directed as an angled reactive ion beam to the substrate 100 at a non-zero angle of incidence (shown as $\theta_c$) with respect to a perpendicular 132 to a main plane P of the substrate 100, where the main plane may be represented by the X-Y plane. Thus, the angled ion beam 120 may directly impact the endwalls 106A as shown. In different non-limiting embodiments of the disclosure, the value of may vary between 5 degrees and 85 degrees, and in particular embodiments between 15 degrees and 60 degrees.

The angled ion beam 120 may be provided using a known etch chemistry chosen according to the nature of the mask layer 112, as well as the layer 114. For example, if the mask layer 112 is an SiN layer, the etch chemistry may be chosen to selectively etch SiN with respect to other materials, such as the material of layer 114, which layer may be silicon oxide. In some embodiments, the etch operation involves directing a pair of an angled reactive ion beams at a non-zero angle of incidence where the two angled reactive ion beams have a value represented by $+/-(\theta c)$ and form mirror image with respect to the X-Z plane, as shown. As such, a pair of endwalls 106A, opposing one another, may be etched. As further shown also in FIG. 1B, for example, the cavities 106 of mask layer 112 may be selectively etched along the Y-direction so as to reduce the spacing between adjacent cavities along the Y-direction to a value of S2, less than S1. As such, the cavities 106 are also elongated along the Y-direction to a value of L2. Notably, during the etch operation of FIG. 2A-2C, the height of the mask layer 112 along the Z-axis may be reduced from the value of h1.

Notably, the angle of incidence of the angled ion beam 120 and duration of the etching during the instance of FIGS. 2A-2C may be limited to limit removal of the mask layer material of mask layer 112 from the top surface of the mask layer 112, and to prevent widening of the cavities 106 along the X-direction. For example, as shown in FIG. 2C, the cavities 106 may retain the original dimension, shown as W1, along the X-direction.

Figure 3D:
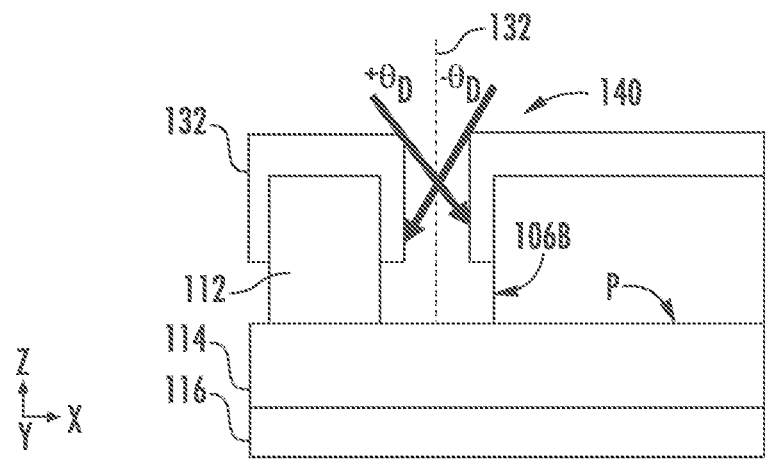
FIG. 3D depicts an enlarged view of a portion of the substrate of FIG. 3C.

Turning to FIG. 3A there is shown a top view of the substrate of FIG. 1A, subsequent to the instance of FIG. 2A, after processing by a deposition beam, in accordance with the present embodiments. FIG. 3B depicts a side cross-sectional view of the substrate of FIG. 3A, while FIG. 3C depicts an end cross-sectional view of the substrate of FIG. 3A, and FIG. 3D depicts an enlarged view of a portion of the substrate of FIG. 3C.

Figure 3E:
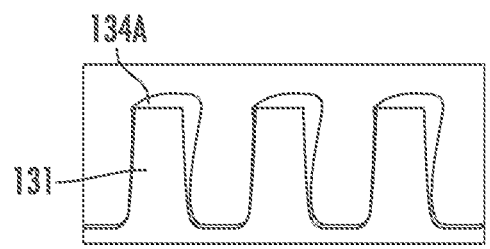
FIG. 3E depicts an example of directional deposition beam processing of a set of patterned features, consistent with embodiments of the disclosure.
Figure 5D:
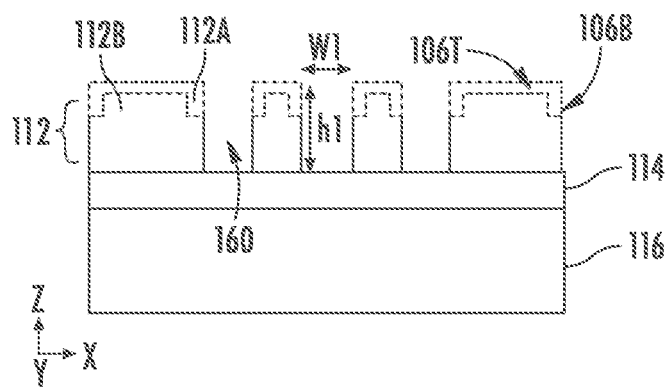
FIG. 5D and FIG. 5E shown an example of processing during a given etch cycle, according to further embodiments of the disclosure.
Figure 5E:
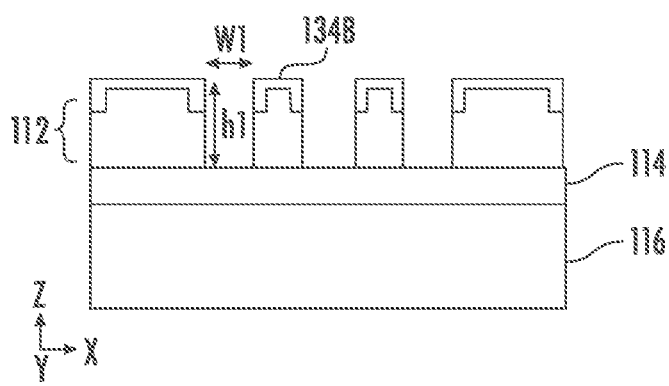

In FIG. 3A, an angled deposition beam 140 is directed to a second side region of the mask set of features of mask layer 112, meaning the sidewalls 106B of the cavities 106, in a second exposure. As such, a protective layer 134 is formed on the second side region. In this example, the second side region encompasses an upper portion of the sidewalls 106B. The protective layer 134 is also formed on the top surface of the mask layer 112. The protective layer 134 may be formed by directing the angled deposition beam 140 at a second non-zero angle of incidence with respect to the perpendicular 132, where the second non-zero angle of incidence of angled deposition beam 140 is represented by $\theta_D$. Depending upon the aspect ratio of the cavities 106 along the X-Z plane shown in FIG. 3C, as well as the value of the second non-zero angle of incidence, the extent of coverage of the sidewalls 106B may be greater or lesser. Notably, in the example of FIGS. 3A-3C, the orientation of the mask layer 112 is rotated 90 degrees about the perpendicular 132 with respect to the orientation of the mask layer 112 in FIG. 2A. Thus, the angled deposition beam 140 is directed at a non-zero angle with respect to the Y-Z plane in the instance of FIGS. 3A-C while the angled ion beam 120 is provided at a non-zero angle of incidence with respect to the X-Z plane in the instance of FIGS. 2A-2C. FIG. 3E depicts an example of directional deposition beam processing of a set of patterned features 131, consistent with embodiments of the disclosure, where a protective layer 134A is deposited just on right sidewalls and upper surfaces, by directing an angled beam from the upper right of the figure.

By providing the protective layer 134 over sidewalls 106B and over the top surface of the mask layer 112, the mask layer 112 may be selectively replenished to prevent etching in unwanted portions of the mask layer. In particular embodiments, the replenishing provided by the protective layer 134 may be tuned to balance out or replace the same amount of material that is removed from certain surfaces by unwanted etching during the etch operation of FIGS. 2A-2C. For example, the amount of material deposited in the select regions where protective layer 134 forms, may be tuned to equal the amount of etching taking place in these select regions during a given etch operation. Thus, the protective layer 134 may be deposited on top surfaces of the mask layer 112 to a layer thickness that matches the amount of material removed from the top surface of the mask layer 112 during the etching operation of FIG. 2A, with the net result that the thickness of mask layer 112 remains constant after each cycle of etching and layer deposition. Likewise, the amount of material of the protective layer 134 deposited on sidewalls 106B may be tailored to match and replenish the amount of material of mask layer 112 that is removed from sidewalls 106B during a previous etch operation. Of course, net material will be removed from targeted surfaces of the mask layer, such as the endwalls 106A. Notably, the relative duration of the deposition operation of FIG. 3A may be adjusted according to the duration of etch operation of FIG. 2A, depending upon relative deposition rates and etch rates.

Subsequently to the operation of FIGS. 3A-3E, an etching operation similar to the operation of FIGS. 2A-2C may be repeated to further elongate the cavities 106 along the Y-axis. FIG. 4A depicts a top view of the substrate of FIG. 1A, subsequent to the instance of FIG. 3A, after further processing by an angled ion beam. FIG. 4B depicts a side cross-sectional view of the substrate of FIG. 4A, while FIG. 4C depicts an end cross-sectional view of the substrate of FIG. 4A. In this example, the angled ion beam 120 is directed to the first side region, meaning a portion of the endwalls 106A, in a third exposure, wherein the first side region is etched a second amount along the first direction, that is, along the Y-axis. The angled ion beam 120 may represent the same conditions as the conditions of angled ion beam 120 in FIG. 2A according to one embodiment. Notably, in the example of FIGS. 4A-4C, the orientation of the mask layer 112 may be rotated −90 degrees about the perpendicular 132 with respect to the orientation of the mask layer 112 in FIG. 3A, and thus back to the original orientation of the angled ion beam 120 with respect to mask layer 112, as shown in FIG. 2A. At this stage, the separation of the cavities 106 may be at a value S3, which value may be a targeted value for the separation of the cavities. As such, further directional etching along the Y-axis of cavities 106 may cease.

In some embodiments a portion of the protective layer 134 may remain after the operation of FIG. 4A, as suggested in FIGS. 4A-4C. In examples where the material of protective layer 134 is different from the material of mask layer 112, the protective layer may be subsequently removed, for example by known selective etching techniques. In other embodiments, residual amounts of protective layer 134 may not be removed before subsequent etching of the layer 114 using mask layer 112. For example, the mask layer 112 and protective layer 134 may be formed from the same hard mask material. During the etch process of FIG. 4A, an appropriate amount of protective layer 134 may be removed to render the dimensions of cavities 106 and the spacing between cavities 106 at desired values.

FIG. 5A depicts a top view of the substrate of FIG. 1A, subsequent to the instance of FIG. 4A, after further processing. FIG. 5B depicts a side cross-sectional view of the substrate of FIG. 5A, while FIG. 5C depicts an end cross-sectional view of the substrate of FIG. 5A. In this example, any residual portion of the protective layer 134 has been removed, rendering the mask layer 112 with the dimension of L3 for the cavities 106 and S3 for separation between cavities 106. Additionally, the width of cavities 106 along the X-axis remains at W1, the same value as the original width of the cavities 106.

Notably in the embodiments, of FIGS. 1A-5C, directional etching and deposition processes may be alternated with one another in a cyclic fashion, through multiple etch cycles, where a given etch cycle involves the following set of operations. The etch cycle may start with 1) directing an angled ion beam to the set of features in a first exposure, when the substrate is oriented at a first twist angle, wherein the set of features is etch a first amount along a first direction; 2) rotating the substrate to a second twist angle after the directing the angled ion beam; and directing an angled deposition beam the set of features in a second exposure, wherein a protective layer is formed on a protected portion of the set of features. In various embodiments, the second twist angle may be a 90 degree rotation about a perpendicular to a main plane of the substrate, with respect to the first twist angle. In this way, the angled deposition beam will tend to strike regions of a surface feature that are oriented perpendicularly with respect to those regions of the surface feature that are impacted by the directional ion beam. According to some embodiments, an etch cycle may be repeated 5 times, 10 times, 20 times or more, depending upon the extent of etching to be performed. For example, to selectively elongate a cavity by 10 nm along an X-direction, a given etch process using an angled ion beam within a given etch cycle may remove 0.5 nm of an endwall along the X-direction, while a given deposition process using an angled deposition beam may deposit a protective layer having a thickness on the order of 0.2 nm. To elongate the cavity by 10 nm may therefore require 20 etch cycles. As a given etch cycle proceeds, a portion of cavity sidewalls and top surface of a mask layer may be continually replenished before faceting or rounding may take place.

In one variant of the processes depicted at FIGS. 1A-5C, multiple cycles may be performed where a given cycle includes an angled directional etching operation and angled directional deposition, in a manner that after a given cycle the structure and shape of a mask are preserved, as discussed above. Turning to FIG. 5D and FIG. 5E, there is shown an example of processing during a given etch cycle, where the structure of FIG. 5D represents a mask layer 112 after directional etching as generally discussed with respect to FIGS. 2A-2C, and the structure of FIG. 5E depicts the mask layer 112 from an end cross-section after replenishment by a directional deposition as generally discussed with respect to FIGS. 3A-3E. The dashed line in FIG. 5D outlines a depletion zone 112A, showing the contours of the original state of mask features 112B that define the cavities 106 before etching, as well as the present surface of mask features 112B of the mask layer 112 after etching, revealing that a certain amount of material has been removed from a top surface 106T of the mask layer 112, as well as from sidewalls 106B. As shown in FIG. 5E, the directional deposition has replenished the mask layer 112, so the cavities 106 of mask layer 112 retains the original dimensions and shape in terms of h1 and w1. This process may be repeated for any number of cycles so that the mask features are repeatedly replenished to original shape and size within the X-Z plane, while the mask features 112B are progressively etched along the Y-axis to selectively elongate the cavities 106. In this manner, the final operation of a series of etch cycles may be represented by FIG. 5E, where the deposition layer 134B may be a different material or the same material as mask layer 112. At this stage, the mask layer 112 may then be used without further processing to etch the underlying layer, layer 114.

To highlight the advantages of the embodiments as shown in FIG. 1A-5C, FIGS. 6A-6C illustrate an example of directional etching used to elongate a cavity, while not using directional deposition. In particular, FIG. 6A depicts a top view of the substrate of FIG. 1A, illustrating a targeted mask pattern after directional etching. FIG. 6B depicts a side cross-sectional view of the substrate of FIG. 6A after directional etching using an ion beam, while not employing a deposition beam, and FIG. 6C depicts an end cross-sectional view of the substrate of FIG. 6B. In FIG. 6A, the mask layer 112 is shown generally as in FIG. 1A, with the addition of a targeted mask pattern 106D, where the cavities 106 are elongated to the dimension L3 by employing the angled ion beam 120, without using angled deposition beam 140, discussed above. In this example, as shown in FIG. 6B and FIG. 6C, the mask layer 112 may be eroded to exhibit rounding or faceting along sides of the cavities 106, including along the X-Z plane, shown in FIG. 6C. Because of this erosion, poor pattern transfer may take place when pattern transfer of the mask pattern of mask layer 112 takes place by etching the layer 114.

In some embodiments, the aforementioned processes may be performed using a ribbon beam-type processing system, where an angled ion beam and/or an angled deposition beam is provided having a ribbon beam shape, where the ribbon cross-section is elongated along one direction with respect to an orthogonal direction.

Figure 7A:
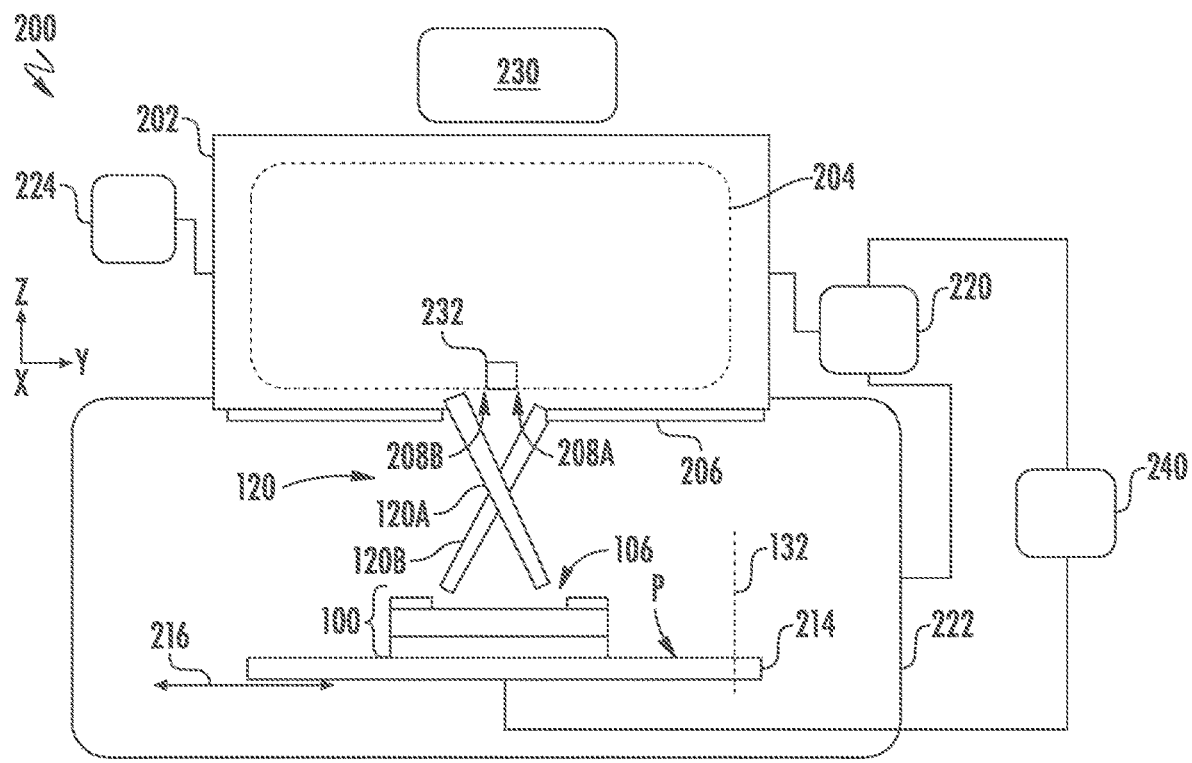
FIG. 7A depicts a side view of a processing apparatus during ion beam processing of a substrate, in accordance with embodiments of the present disclosure.
Figure 7B:
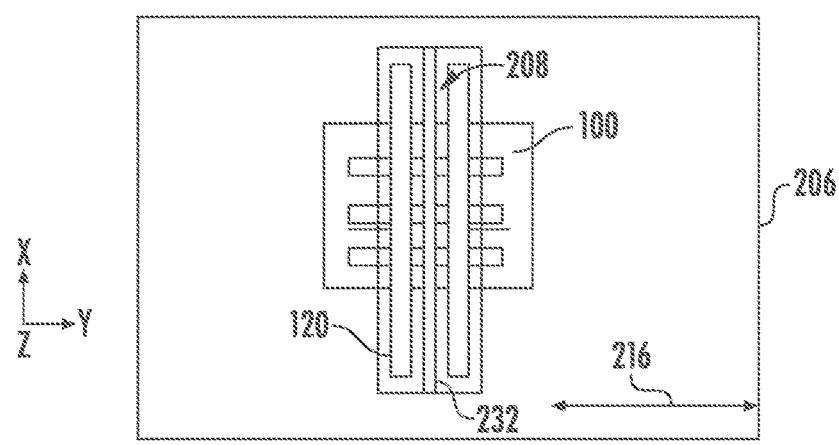
FIG. 7B depicts a to view of a portion of the processing apparatus of FIG. 7A, during the instance depicted in FIG. 7A.
Figure 7C:
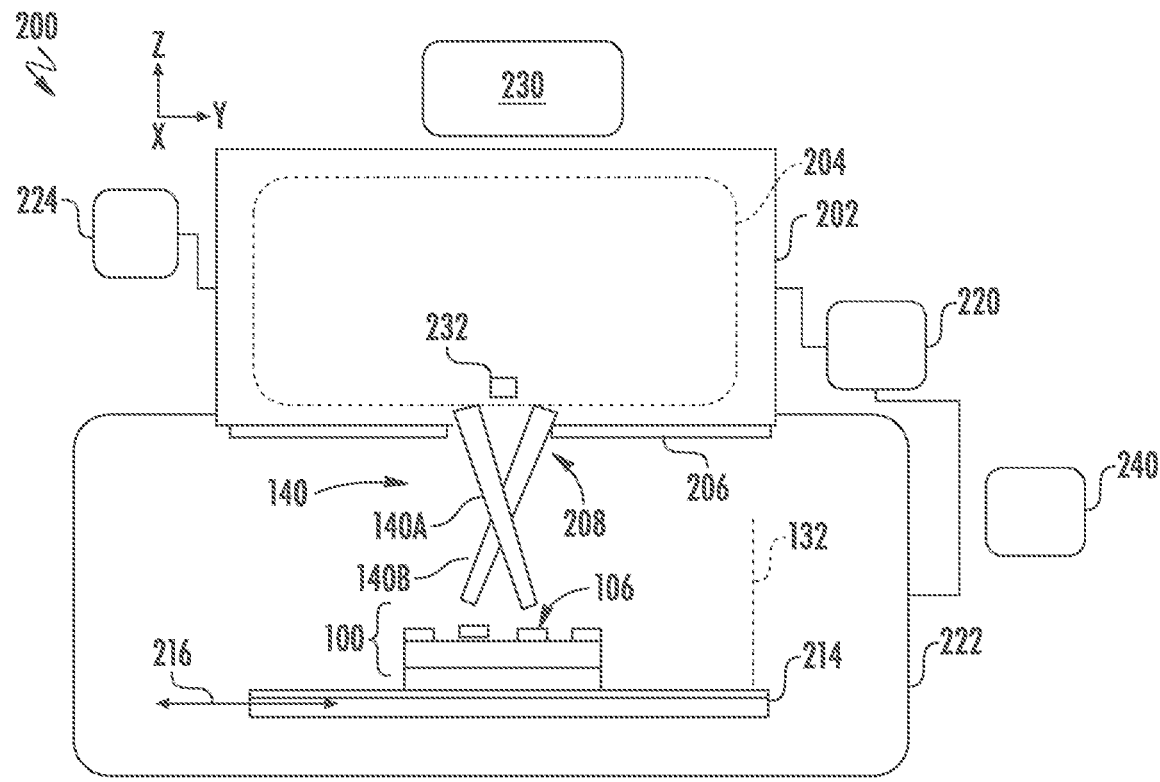
FIG. 7C depicts a side view of a processing apparatus during deposition beam processing of a substrate, in accordance with embodiments of the present disclosure.
Figure 7D:
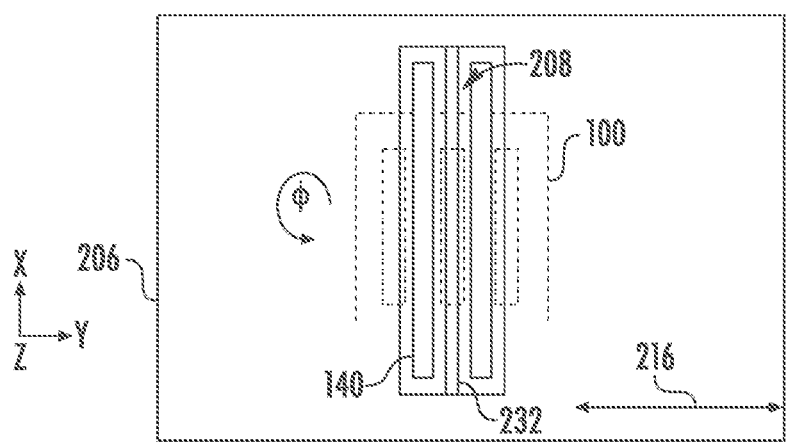
FIG. 7D depicts a to view of a portion of the processing apparatus of FIG. 7A, during the instance depicted in FIG. 7C.

FIG. 7A depicts a side view of a processing apparatus 200 during ion beam processing of a substrate, in accordance with embodiments of the present disclosure. FIG. 7B depicts a top view of a portion of the processing apparatus of FIG. 7A, during the instance depicted in FIG. 7A. FIG. 7C depicts a side view of a processing apparatus during deposition beam processing of a substrate, in accordance with embodiments of the present disclosure. FIG. 7D depicts a to view of a portion of the processing apparatus of FIG. 7A, during the instance depicted in FIG. 7C.

As to the general features of the processing apparatus 200, this apparatus represents a processing apparatus for selectively etching processing portions of a substrate, such as selectively elongating a cavity. The processing apparatus 200 may be a plasma-based processing system having a plasma chamber 202 for generating a plasma 204 therein by any convenient method as known in the art. A power supply 230, may, for example, be an RF power supply to generate the plasma 204. An extraction plate 206 may be provided as shown, having an extraction aperture 208, where a selective etching may be performed to selectively remove sidewall layers. A substrate, such as a substrate 100 having the aforementioned structure as shown at FIGS. 1A-1C, is disposed in the process chamber 222. A substrate plane of the substrate 100 is represented by the X-Y plane of the Cartesian coordinate system shown, while a perpendicular to the plane of the substrate 100 lies along the Z-axis (Z-direction).

As further shown in FIG. 7A, a controller 240 may be provided to send control signals to the bias supply 220 and to the substrate stage 214.

In one example, the view of FIG. 7A may represent a variant of the selective etching operation shown in FIG. 1B, for example. During a directional etching operation, a plasma, such as a reactive plasma is formed using a reactive chemistry in the plasma chamber 202, and an angled ion beam 120 is extracted as a pair of ion beams, as shown. Notably, the processing apparatus 200 includes a beam blocker 232, disposed adjacent the extraction aperture 208. The beam blocker 232 is sized and positioned to define a first aperture 208A and a second aperture 208B, where the first aperture 208A forms a first angled ion beam 120A, and the second aperture 208B forms a second angled ion beam 120B. The two angled ion beams may define angles of incidence with respect to the perpendicular 132, equal in magnitude, opposite in direction. In one embodiment, the first angled ion beam 120A and the second angled ion beam 120B may represent an angled reactive ion beam. The beam blocker offset along the Z-axis with respect to extraction plate 206 may help define the angle of the angled ion beams.

In particular, as shown in FIG. 7A, and with reference to the geometry of FIGS. 2A-2C, the angled ion beam 120, forming a non-zero angle of incidence with respect to the Z-axis (normal to the substrate plane), may strike the regions of cavities 106 oriented along the X-Z plane, as noted. As such, the first angled ion beam 120A and the second angled ion beam 120B may selectively etch the endwalls 106A, while not etching the sidewalls 106B (oriented along the Y-Z plane), and thus selectively elongate of the cavities 106 to generate the elongated structure of cavities 106, as shown in FIG. 5A to FIG. 5C.

In the example of FIG. 7B, the angled ion beam 120 is provided as a pair of ribbon ion beams that are formed by an elongated extraction aperture, extending to a beam width along the X-direction, where the beam width is adequate to expose an entire width of the substrate 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

The angled ion beams 120 may be extracted when a voltage difference is applied using a bias voltage source, shown as bias supply 220, between the plasma chamber 202 and substrate 100 as in known systems. The bias supply 220 may be coupled to the process chamber 222, for example, where the process chamber 222 and substrate 100 are held at the same potential. In various embodiments, the angled ion beam 120 may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another. When configured in the shape of a ribbon beam as in FIG. 7B, these angled ion beams may expose an entirety of the substrate 100 to reactive ion etching of the cavities 106 distributed in devices across the substrate 100, by scanning the substrate platen 214 along the scan direction 216, as shown.

In various embodiments, the value of the non-zero angle of incidence may vary from 5 degrees to 85 degrees, while in some embodiments the value may range between 15 degrees and 60 degrees. The embodiments are not limited in this context. The angled ion beam 120 may be composed of any convenient gas mixture, including inert gas, reactive gas, and may be provided in conjunction with other gaseous species in some embodiments. Gas may be provided from a gas source 224, where the gas source 224 may be a gas manifold coupled to provide a plurality of different gases to the plasma chamber 202. In particular embodiments, the angled ion beam 120 and other reactive species may be provided as a predetermined etch recipe to the substrate 100 so as to perform a directed reactive ion etching of targeted sidewalls of patterning layers on substrate 100. As discussed above, the etch recipe may be selective with respect to the material of the layer 114, so as to remove material of the mask layer 112, while not etching the layer 114, or etching the layer 114 to a lesser extent.

FIG. 7C and FIG. 7D depict a subsequent instance of processing the substrate 100, generally as discussed above with respect to FIGS. 4A-4C. In this instance, the processing apparatus 200 generates angled deposition beam 140, as a first angled deposition beam 140A and a second angled deposition beam 140B, using the same extraction geometry as discussed above with respect to FIGS. 7A and 7B. Notably, in this instance, the substrate stage 214 has been rotated through a twist angle of 90 degrees with respect to the configuration of FIG. 7A and FIG. 7B.

In one implementation, the angled deposition beam 140 may be generated using the same conditions as generating the angled ion beam 120, discussed above, save for a change in the bias applied between the plasma chamber 202 and the substrate 100. For example, to generate the angled ion beam 120, a −500 V bias may be applied between the substrate 100 and plasma chamber 202, to extract a reactive ion beam having ions with energies in the range of 500 eV for singly charged positive ions. As such, during a reactive ion etching process, the net result of competing processes of etching the mask layer 112 and depositing a polymer film on the mask layer 112, may be to etch the mask layer 112, due to the energy of the ions of angled ion beam 120. In the example of FIG. 7C, the angled deposition beam may 140 be generated by reducing the bias between plasma chamber 202 and substrate 100 to a value of −50 V, for example, or 0 V, wherein the energy of any ions present in the angled deposition beam 140 will be much less than in the etching process of FIG. 7A, favoring a net deposition due to radicals, and other polymer-forming species in the angled deposition beam 140.

In some embodiments, using processing apparatus 200, the substrate 100 may be scanned along the Y-direction for at least one scan with a high bias voltage applied, followed by rotating the substrate 100 through 90 degrees about the perpendicular 132 within the X-Y plane, accompanied by reducing the level of or extinguishing the bias voltage, and scanning the substrate 100 along the Y-direction for at least one additional scan. This sequence of operations may be repeated through multiple cycles to selectively etch surface features of a mask layer along a given direction, while avoiding unwanted mask loss, rounding, faceting, and other side effects generated during continuous etching without the use of the angled deposition of the present embodiments.

While the embodiments of FIGS. 7A-7D depict a single plasma chamber, in other embodiments, two plasma chambers may be provided, wherein a first plasma chamber is used to direct an angled ion beam to the substrate, and a second plasma chamber is used to direct an angled deposition beam to the substrate. The substrate may be transported between positions adjacent the first plasma chamber and second plasma chamber to perform an etch cycle. An advantage of this latter configuration is that the second plasma chamber may be configured with an extraction assembly that directs the deposition beam to the substrate at a different angle of incidence than the angle of incidence used for the angled ion beam, producing increased process flexibility. Additionally, different plasma chemistry may be employed in the deposition beam plasma chamber as opposed to the ion beam plasma chamber, so that a substrate may be processed rapidly by subjecting the substrate to an etch chemistry different than the deposition chemistry, without incurring process delay that may occur to switch chemistry within a common plasma chamber.

Figure 7E:
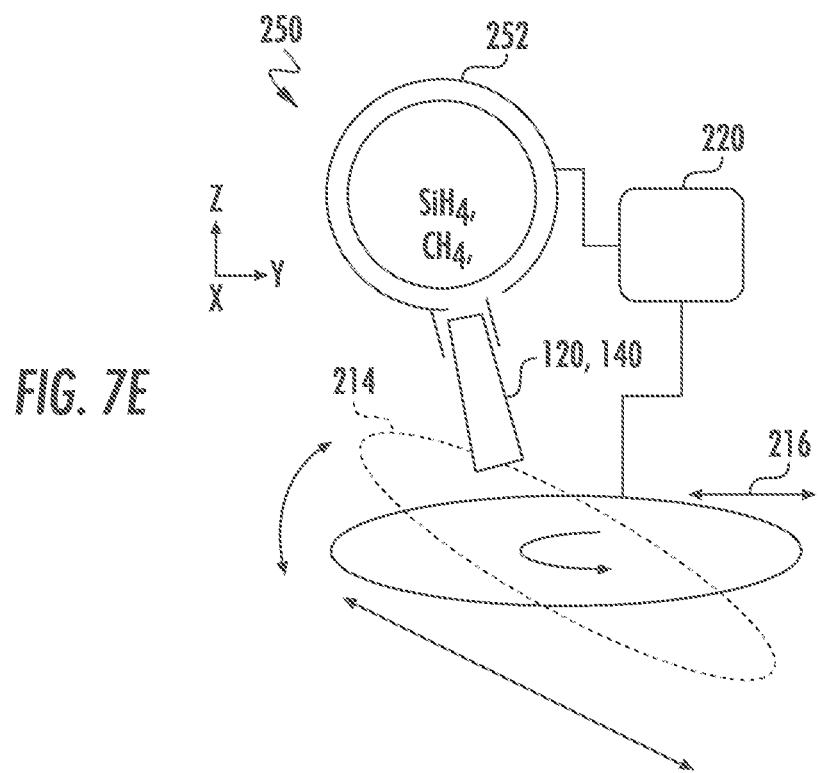
FIG. 7E, FIG. 7F, and FIG. 7G depict aspects of another apparatus, according to embodiments of the present disclosure.
Figure 7F:
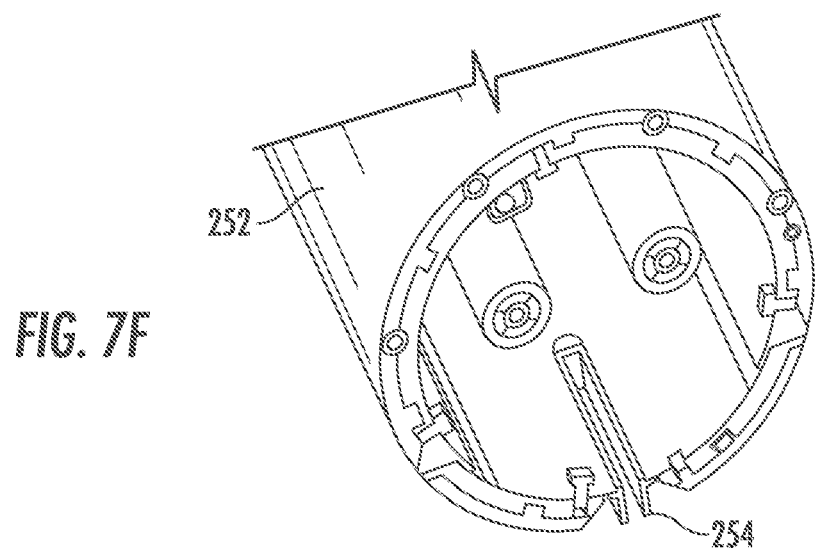
Figure 7G:
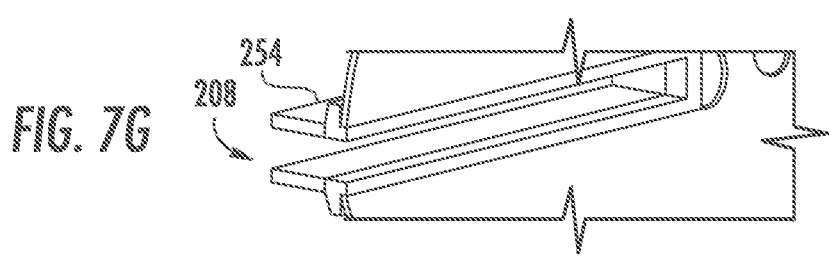

FIG. 7E, FIG. 7F, and FIG. 7G depict aspects of another apparatus, according to embodiments of the present disclosure. The apparatus 250 includes a cylindrical plasma chamber, shown as plasma chamber 252, elongated along the X-axis, and including an elongated aperture, shown as extraction aperture 208, where the extraction aperture 208 is bounded by a nozzle structure 254 that extends radially outwardly from the plasma chamber 252. In various non-limiting embodiments, the plasma chamber 252 may be rotatable about the X-axis, the substrate stage 214 may be tiltable about the X-axis, may be scannable along the Y-axis, and rotatable about the Z-axis. As such, the aforementioned operations of directional angled etching and directional angled deposition may be performed by alternately applying a bias voltage between the plasma chamber 252 and substrate stage 214 during a first exposure and removing the bias voltage between substrate stage 214 and plasma chamber 252 during a second exposure, while also rotating the substrate stage 214 90 degrees about the Z-axis between the first exposure and the second exposure. An advantage provided by the apparatus 250 is that the nozzle structure 254 may tend to collimate a deposition beam having neutral radicals that otherwise may tend to diverge after exiting the plasma chamber 252, thus preserving and improving directionality of a deposition beam used to selectively deposit a protection layer.

Figure 8:
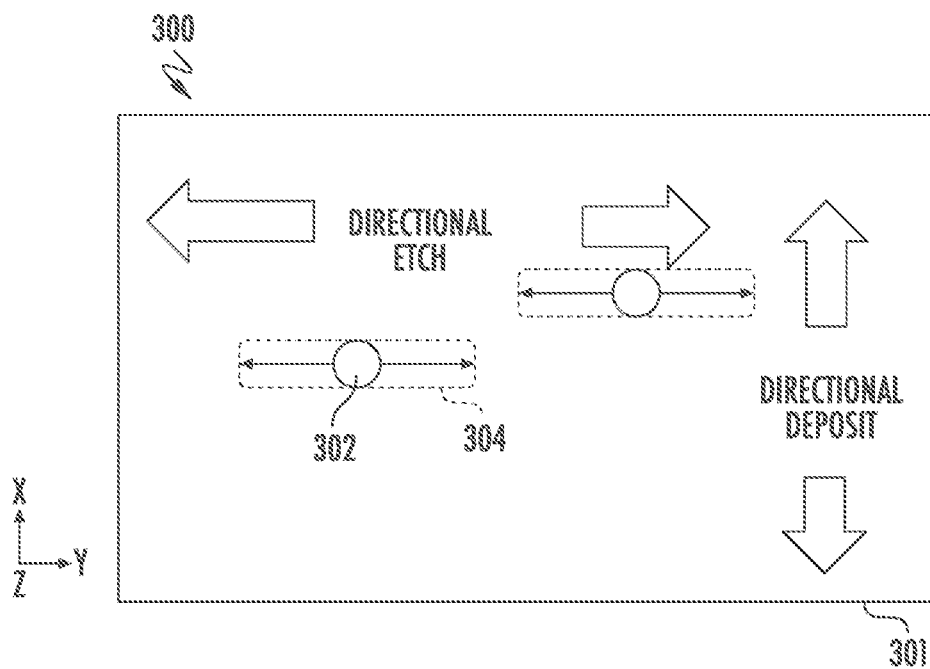
FIG. 8 depicts the geometry for changing the shape of a patterned feature by combined directional ion beam processing and directional deposition beam processing, according to an embodiment of the disclosure.

FIG. 8 depicts the geometry for changing the shape of a patterned feature by combined directional ion beam processing and directional deposition beam processing, according to an embodiment of the disclosure. In this example, directional etching and directional deposition processes may be combined as generally described with respect to FIGS. 1A to 5C, except in this instance a substrate 300 is provided with a mask layer 301 having a series of cavities shaped as vias or circles. By performing the operations of FIGS. 2A to 5C, the cavities 302 may be selectively elongated along the Y-direction to form trenches 304, where directional etching is interspersed with directional deposition in a direction orthogonal to the directional etching when viewed in the X-Y plane, as shown. As such, rounding or faceting of the trenches 304 may be avoided.

Figure 9:
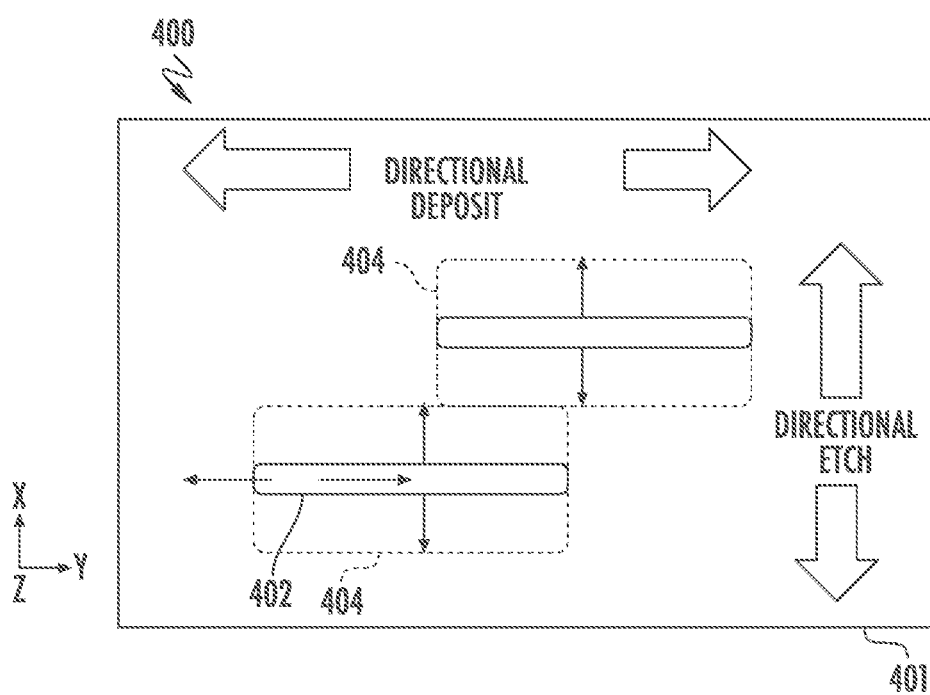
FIG. 9 depicts the geometry for generating a composite merged shape by merging multiple patterned features using a combined directional ion beam processing and directional deposition beam processing, according to another embodiment of the disclosure.

FIG. 9 depicts the geometry for generating a composite merged shape by merging multiple patterned features using a combined directional ion beam processing and directional deposition beam processing, according to another embodiment of the disclosure. In this example, directional etching and directional deposition processes may be combined as generally described with respect to FIGS. 1A to 5C, except in this instance a substrate 400 is provided with a mask layer 401 having a series of cavities shaped as trenches 402, offset from one another in a staggered fashion as shown. By performing the operations of FIGS. 2A to 5C, the trenches 402 may be selectively elongated along the X-direction to form a merged shape 404, where directional etching is interspersed with directional deposition in a direction orthogonal to the directional etching when viewed in the X-Y plane, as shown. As such, rounding or faceting of mask surfaces during formation of the merged shape 404 may be avoided.

FIG. 10 depicts an exemplary process flow 500, according to one embodiment of the disclosure. At block 502, a set of features is provided in a mask layer. A given feature of the set of features may be characterized by a first dimension along a first direction. In one example a cavity formed in a mask layer may have a first length along a given direction.

At block 504, an angled ion beam is directed to a first side region of the set of features during a first exposure. The first side region may constitute an endwall of a cavity according to various embodiments. As such, the first side region is etched a first amount along the first direction.

At block 506, an angled deposition beam is directed to a second side region of the set of features in a second exposure, where the second side region being is oriented perpendicularly with respect to the first side region. For example, the second side region may constitute an upper portion of sidewalls of a cavity whose endwalls are etched in the operation of block 404. As such, a protective layer is formed on the second side region.

At block 508 an angled ion beam is directed to the first side region in a third exposure, wherein the first side region is etched an additional amount along the first direction.

The flow then proceeds to decision block 510, where a determination is made as to whether a final or target dimension is reached. If so, the flow proceeds to block 512, where the mask layer is used to etch a subjacent layer, If not, the flow returns to block 506.

Notably, in the aforementioned embodiments, examples of using a common plasma chamber and a common plasma chemistry have been detailed. However, in other embodiments, a different chamber may be used to provide a deposition beam to a substrate. For added flexibility, a reactive etching ion beam could be provided using a CFx etch chemistry, while a deposition beam is provided with a different chemistry to deposit, for example, a C, $SiO_2$, SiN, or other material. While adding flexibility, this approach may entail switching of gases provided to a plasma chamber, between rotations, and would add to process time.

Moreover, while the aforementioned embodiments illustrate the iterative use of angled ion beam etching and angled ion beam deposition, with the used of substrate rotation between etching and deposition, the relative amount of etching or deposition within a given operation may depend upon the application, where, for a given mask layer, and subjacent layer, experimentation may be used to determine the balance between deposition and erosion for each iteration or cycle of deposition and etch. For instance there could be one substrate scan for deposition performed for every ten etching scans, or the reverse where one etching scan is performed for every 10 deposition scans, depending on the etch chemistry, ion bias, etc.

The present embodiments provide various advantages over conventional processing to define features in a substrate. One advantage lies in the ability to selectively elongate a cavity along just one direction, while preserving the dimension of the cavity along a second direction, perpendicular to the first direction. Another advantage is the ability to reduce cavities below the spacing achieved by known lithography processes. An example of this ability is the reduction of tip-to-tip separation between adjacent trenches such as contact trenches. Another advantage provided by the present embodiments is the ability to prevent undue thickness loss of a hardmask and reduce corner rounding in a cavity formed in the hardmask layer, while still selectively elongating the cavity along a targeted direction. A further advantage is the ability to reduce the number of masks used to generate a pattern of features, where the features may be separated by a distance less than the threshold separation achievable by a single mask. This reducing the number of masks has the further advantageous effect of reducing overlay error for printing the pattern of features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of patterning a substrate, comprising:
generating a plasma in a plasma chamber;
providing a substrate, on a substrate stage adjacent the plasma chamber, the substrate comprising a layer having a set of features;
providing an extraction assembly along a side of the plasma chamber, between the plasma and the substrate stage;
sending a first control signal to apply a first bias voltage between the plasma chamber and the substrate while the substrate stage is arranged at a first twist angle, wherein an angled ion beam is directed at a first energy to the substrate in a first exposure;
sending a second control signal to apply a second bias voltage between the plasma chamber and the substrate; and
sending a third control signal to perform rotation of the substrate stage to a second twist angle, wherein the angled ion beam is directed at a second energy to the substrate in a second exposure, when the substrate stage is arranged at the second twist angle,
wherein the angled ion beam performs a first etch of a first side region of the set of features to a first amount along a first direction, during the first exposure, and
wherein the angled ion beam performs a deposit of a protective layer on a second side region of the set of features, the second side region being oriented perpendicularly with respect to the first side region, during the second exposure.

2. The method of claim 1, further comprising
sending a further control signal to apply the first bias voltage between the plasma chamber and the substrate; and sending concurrently with the further control signal, an additional control signal to rotate the substrate stage to the first twist angle, wherein in a third exposure the reactive angled ion beam performs a second etch of the first side region of the set of features to a second amount along the first direction, after the reactive angled ion beam deposits the protective layer on the second side region.

3. The method of claim 1, wherein the first bias voltage is a negative bias, and wherein the second bias voltage is zero bias.

4. The method of claim 1, wherein the angled ion beam has a ribbon beam shape.

5. The method of claim 1, wherein the plasma chamber is a cylindrical plasma chamber, and wherein the extraction assembly comprises an elongated extraction aperture, the elongated extraction aperture being bounded by a nozzle structure that extends radially outwardly from the plasma chamber.

6. The method of claim 1, wherein the first etch of the first side region and the deposit of the protective layer on the second side region constitute an etch cycle, the method further comprising: repeating the etch cycle.

7. A method of patterning a substrate, comprising:

providing a set of cavities in a mask layer, the mask layer being disposed on a layer of the substrate, the set of cavities comprising an endwall and a sidewall;

directing an angled ion beam in a plurality of exposures to the mask layer to elongate the set of cavities along a first direction within a main plane of the substrate, wherein the angled ion beam is directed to the endwall at a first ion energy in a first exposure of the plurality of exposures, and wherein the angled ion beam is directed to the sidewall in a second exposure of the plurality of exposures at a second ion energy less than the first ion energy, wherein a protective layer is formed on the sidewall during the second exposure.

8. The method of claim 7, wherein a tip-to-tip spacing between adjacent cavities of the plurality of cavities is reduced after the plurality of directional etch operations.

9. The method of claim 7, wherein the angled ion beam is provided as an angled reactive ion beam to the substrate at a non-zero angle of incidence with respect to a perpendicular to the main plane of the substrate.

* * * * *